(12) United States Patent
Holle et al.

(10) Patent No.: US 7,755,357 B2
(45) Date of Patent: Jul. 13, 2010

(54) RADIO FREQUENCY COIL WITH TRANSMISSION LINE END-RINGS

(75) Inventors: Eerke Holle, Best (NL); Paulus C. H. A. Haans, Best (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 439 days.

(21) Appl. No.: 11/721,545

(22) PCT Filed: Dec. 20, 2005

(86) PCT No.: PCT/IB2005/054337

§ 371 (c)(1),
(2), (4) Date: Jun. 13, 2007

(87) PCT Pub. No.: WO2006/067746

PCT Pub. Date: Jun. 29, 2006

(65) Prior Publication Data

US 2009/0243611 A1    Oct. 1, 2009

Related U.S. Application Data

(60) Provisional application No. 60/638,630, filed on Dec. 22, 2004.

(51) Int. Cl.
*G01V 3/00* (2006.01)
(52) U.S. Cl. ........................ 324/318; 324/322
(58) Field of Classification Search ......... 324/300–322; 600/407–445
See application file for complete search history.

(56) References Cited

U.S. PATENT DOCUMENTS

| 5,041,790 | A |  | 8/1991 | Tropp et al. |
| 5,581,186 | A |  | 12/1996 | Keller |
| 6,100,694 | A | * | 8/2000 | Wong .......................... 324/318 |
| 6,232,779 | B1 |  | 5/2001 | Tropp et al. |
| 6,982,553 | B2 | * | 1/2006 | Holle .......................... 324/318 |
| 7,088,104 | B2 |  | 8/2006 | Bottomley |
| 2003/0184293 | A1 |  | 10/2003 | Boskamp et al. |
| 2008/0129298 | A1 | * | 6/2008 | Vaughan et al. ............. 324/322 |
| 2008/0186026 | A1 | * | 8/2008 | Leussler et al. ............. 324/318 |
| 2008/0272786 | A1 | * | 11/2008 | Luedeke et al. ............. 324/322 |
| 2009/0206840 | A1 | * | 8/2009 | Overweg et al. ............ 324/322 |

FOREIGN PATENT DOCUMENTS

| JP | 07308304 A | 11/1995 |
| WO | 03036318 A1 | 5/2003 |

* cited by examiner

*Primary Examiner*—Brij B Shrivastav

(57) ABSTRACT

A radio frequency coil for transmitting or receiving signals at a magnetic resonance frequency includes an arrangement of substantially parallel rungs (70, 70', 70") and one or more generally annular strip-type end-rings (78, 78', 78", 80) disposed generally transverse to the parallel rungs and connected with the rungs. Each generally annular strip-type end-ring includes at least two conductor layers (82, 82', 82", 84, 84', 84", 86, 88) separated by a dielectric layer (72, 72a, 72b). A radio frequency shield (34) substantially surrounds the arrangement of substantially parallel rungs (70, 70', 70"). At least one of the conductor layers of each end-ring is connected with the radio frequency shield.

20 Claims, 10 Drawing Sheets

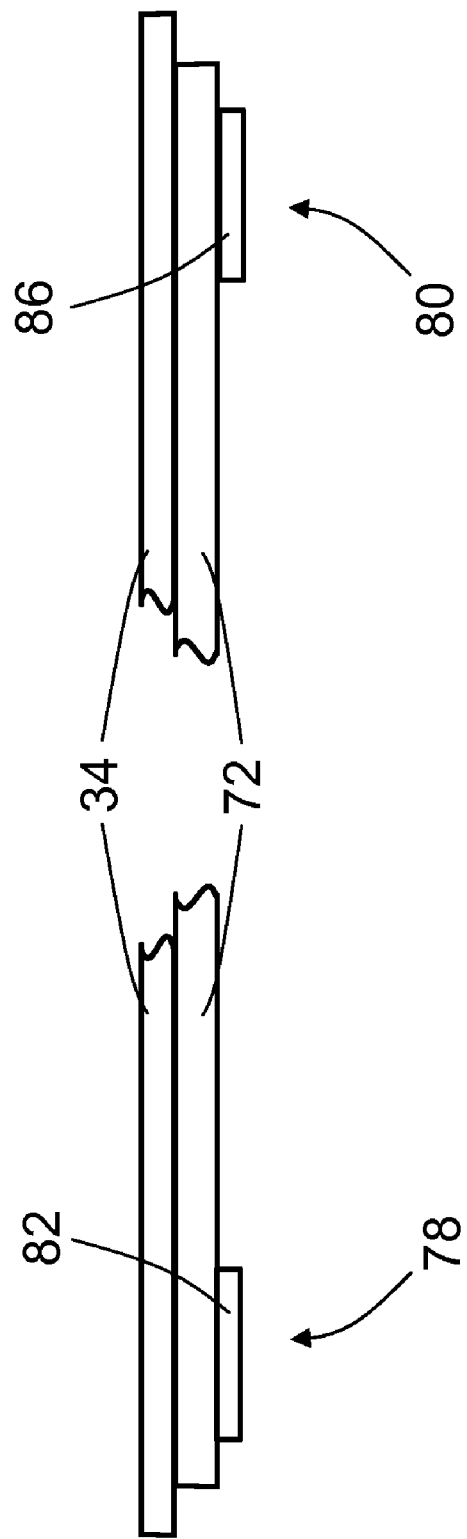

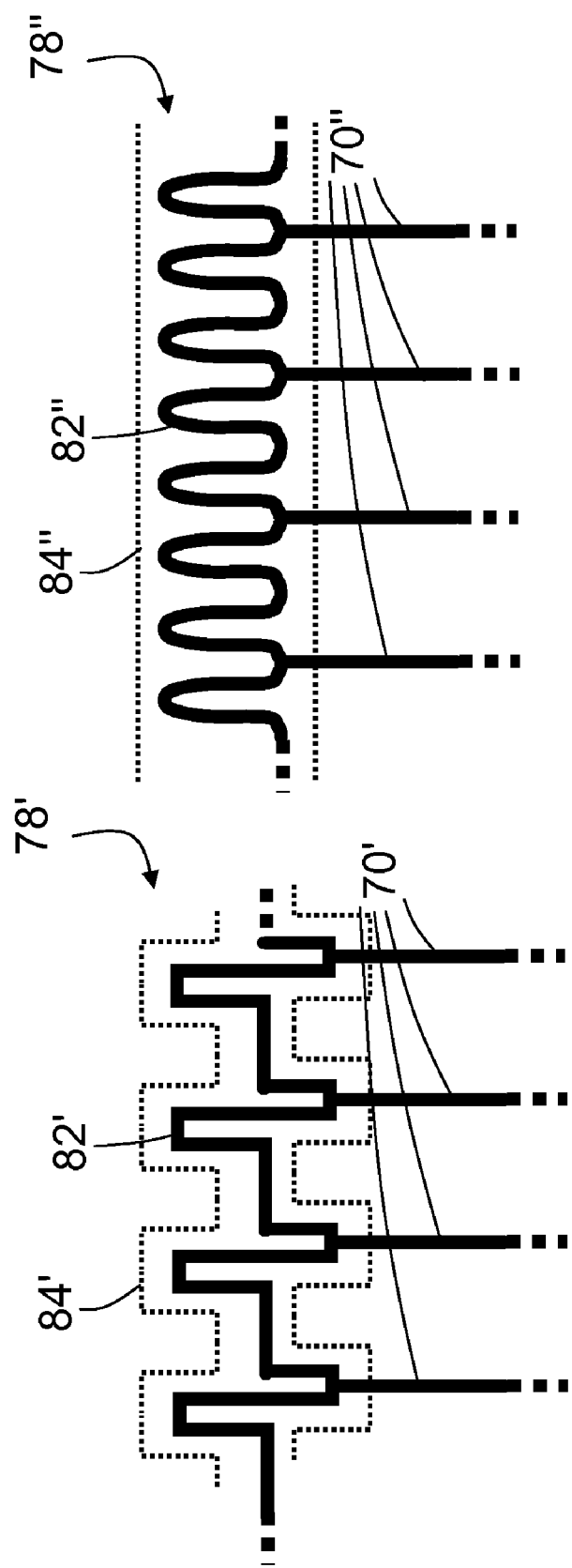

RADIO FREQUENCY COIL WITH TRANSMISSION LINE END-RINGS

CROSS REFERENCE TO RELATED APPLICATIONS

This application claims the benefit of U.S. provisional application Ser. No. 60/638,630 filed Dec. 22, 2004, which is incorporated herein by reference.

DESCRIPTION

The following relates to the magnetic resonance arts. It finds particular application in magnetic resonance imaging coils and scanners, and will be described with particular reference thereto. More generally, it finds application in magnetic resonance systems for imaging, spectroscopy, and so forth.

The end-rings of radio frequency coils for magnetic resonance applications carry a substantial amount of current. Generally the current on the end-rings is determined by the number of rungs, with more rungs producing a higher end-ring current/rung current ratio. For N rungs, this ratio of currents is estimated to be $1/\sqrt{2-2\cdot\cos(\phi)}$, where $\phi=2\cdot\pi/N$. For N=16 rungs, this gives an end-ring current/rung current ratio of 2.56. These high end-ring currents can lead to degraded coil performance due to high local specific absorption ratio values near the end-rings and increased inhomogeneity of the $B_1$ field. Moreover, existing end-rings typically include lumped capacitive elements to tune the coil to the resonance frequency in order to satisfy the current ratio. Other capacitive elements connect the rungs with the end-rings. These capacitive elements increase coil manufacturing costs.

International publication WO 03/036318 A1 published May 1, 2003 discloses an improvement in which the end-rings are embodied as closed coaxial transmission line loops having an inner conductor and an outer concentric sheathing conductor. The shielding provided by the outer sheathing conductor reduces the detrimental effects of high currents in the end-rings. However, coaxial transmission line end-rings complicate manufacturing due to the increased complexity of the end-rings and due to the need to couple the rungs to the sheathed inner conductors of the end-rings. This coupling involves forming openings in the sheathing outer conductor.

The following contemplates improved apparatuses and methods that overcome the aforementioned limitations and others.

According to one aspect, a radio frequency coil is disclosed for transmitting or receiving signals at a magnetic resonance frequency, including an arrangement of substantially parallel rungs and one or more generally annular strip-type end-rings disposed generally transverse to the parallel rungs and connected with the rungs. Each generally annular strip-type end-ring includes at least two conductor layers separated by a dielectric layer. A radio frequency shield substantially surrounds the arrangement of substantially parallel rungs. At least one of the conductor layers of each end-ring is connected with the radio frequency shield.

According to another aspect, a magnetic resonance scanner is disclosed. A main magnet generates a main magnetic field in an examination region. Magnetic field gradient coils superimpose selected magnetic field gradients on the main magnetic field in the examination region. A radio frequency coil includes an arrangement of substantially parallel rungs and one or more generally annular strip-type end-rings disposed generally transverse to the parallel rungs and connected with the rungs. Each generally annular strip-type end-ring includes at least two conductor layers separated by a dielectric layer. A radio frequency shield substantially surrounds the arrangement of substantially parallel rungs. At least one of the conductor layers of each end-ring is connected with the radio frequency shield.

According to yet another aspect, a radio frequency coil for transmitting or receiving signals at a magnetic resonance frequency includes arrangement of substantially parallel rungs and one or more generally annular strip-type end-rings disposed generally transverse to the parallel rungs and connected with the rungs. Each generally annular strip-type end-ring has a length between adjacent rungs that is greater than a distance between the adjacent rungs.

One advantage resides in reduction or elimination of discrete components such as lumped capacitive elements.

Another advantage resides in simplified coil manufacturing and reduced manufacturing cost.

Another advantage resides in improved performance of the radio frequency coil.

Numerous additional advantages and benefits will become apparent to those of ordinary skill in the art upon reading the following detailed description.

The invention may take form in various components and arrangements of components, and in various process operations and arrangements of process operations. The drawings are only for the purpose of illustrating preferred embodiments and are not to be construed as limiting the invention.

FIG. 1 diagrammatically shows a magnetic resonance imaging system employing a radio frequency coil.

Figure 2:
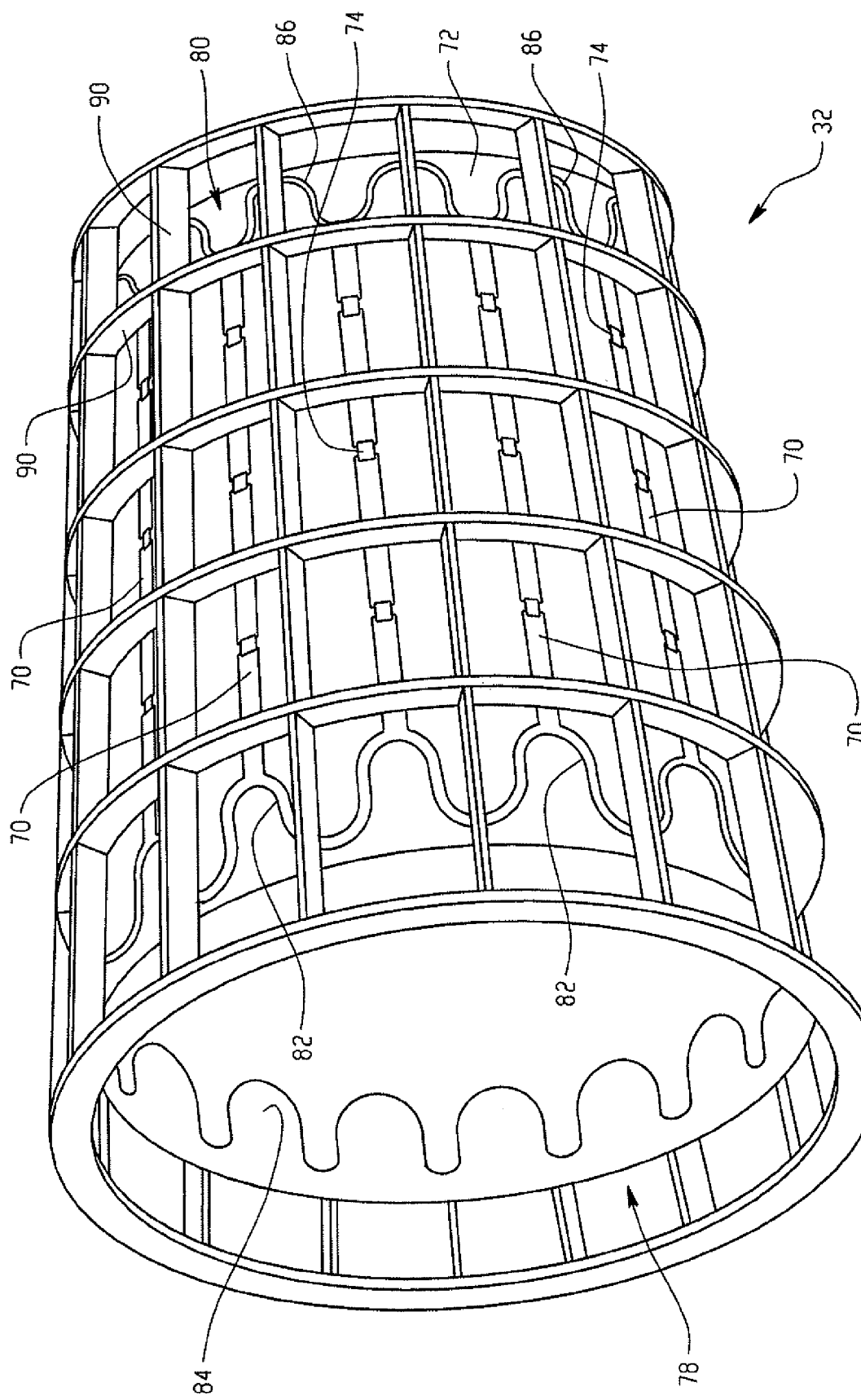
FIG. 2 shows a perspective view of the radio frequency coil of FIG. 1 along with spacer elements for spacing the radio frequency shield away from the coil.
Figure 4:
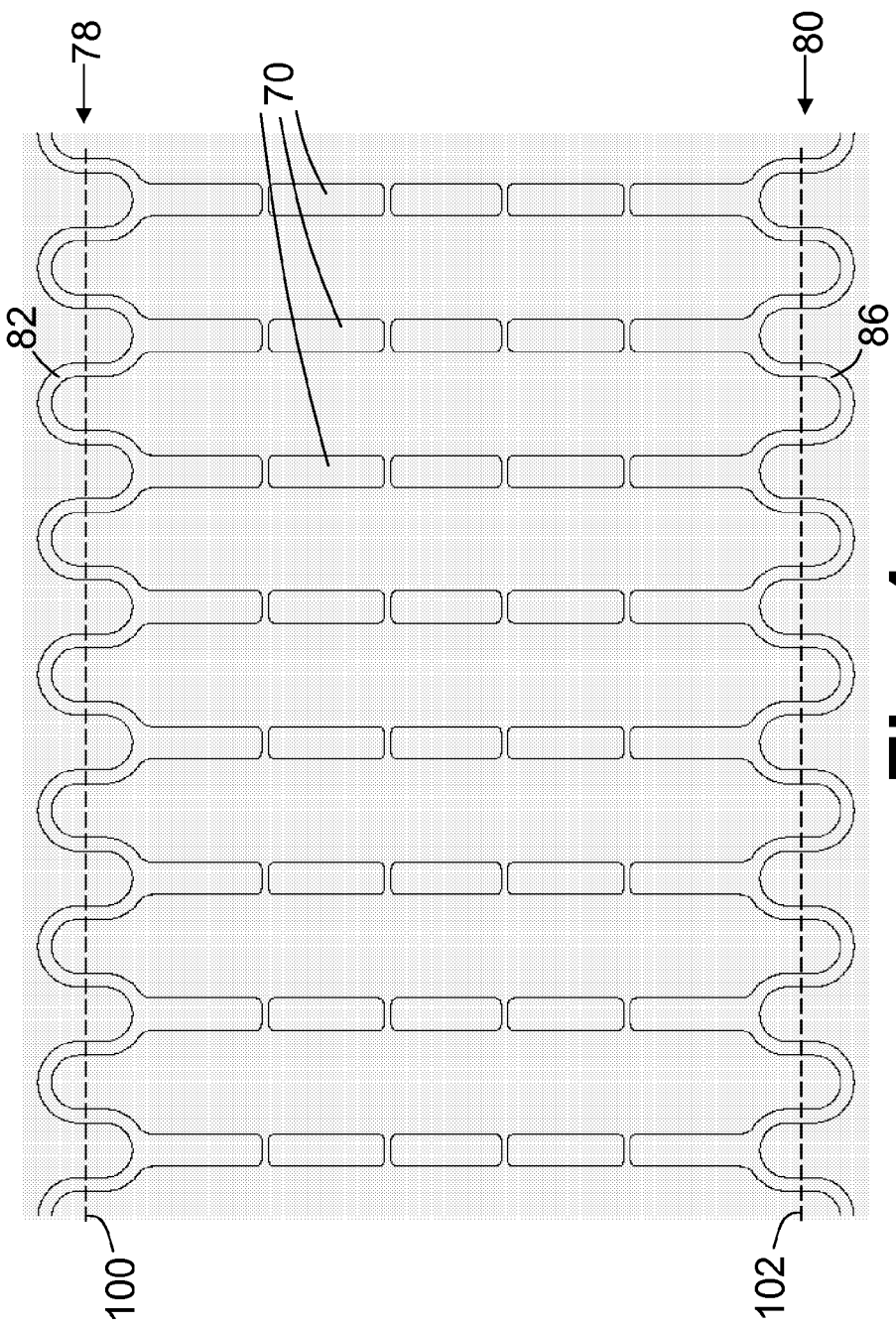

FIG. 4 shows a portion of an unrolled layout of printed circuitry disposed on the outside of the electrically non-conductive generally cylindrical substrate of the radio frequency coil of FIG. 2. This printed circuitry defines the first or outer conductors of the end-rings and the rungs (with the lumped capacitive elements omitted from the rungs). FIG. 4 shows only eight of the rungs of the coil.

Figure 5:
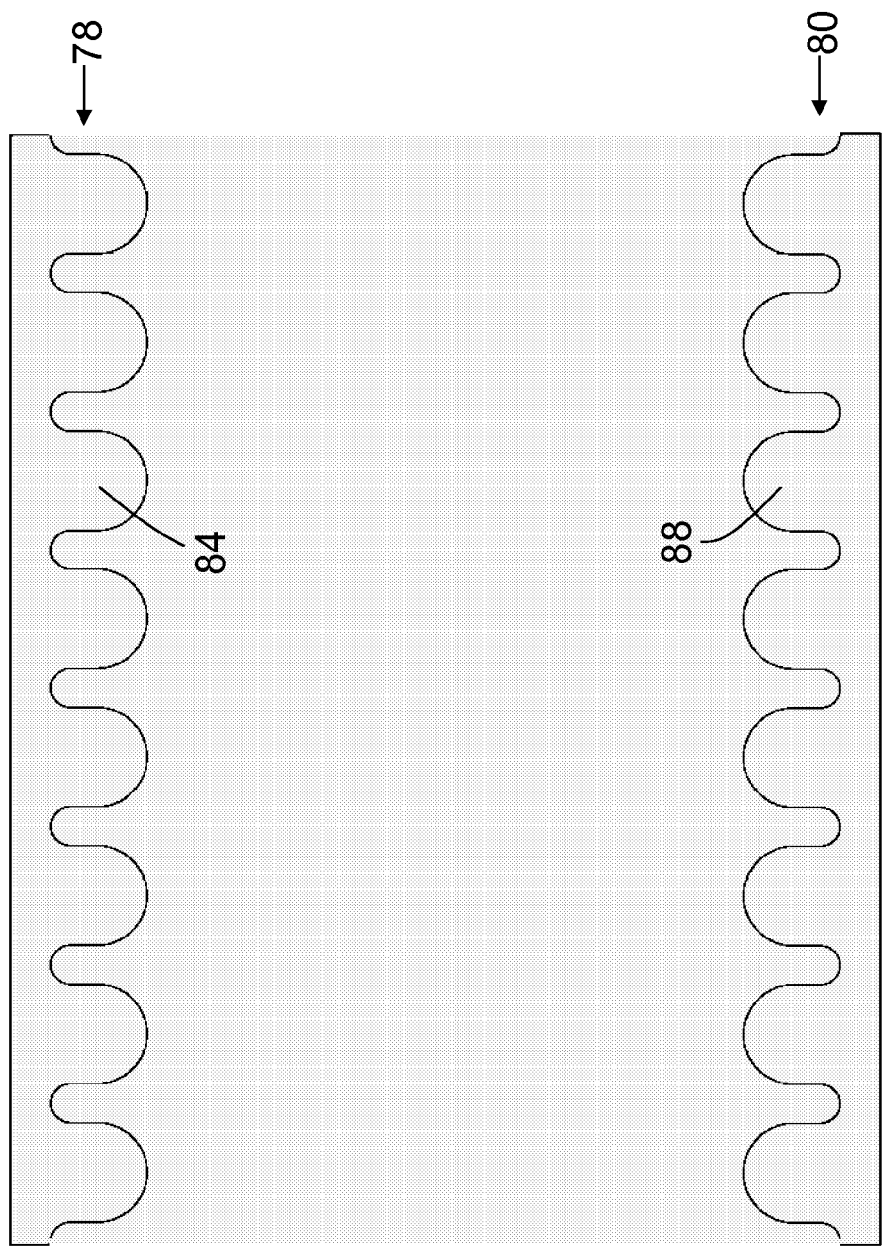

FIG. 5 shows a portion of an unrolled layout of printed circuitry disposed on the inside of the electrically non-conductive generally cylindrical substrate of the radio frequency coil of FIG. 2. This printed circuitry defines the second, inner shielding conductors of the end-rings. FIG. 5 shows only eight of the scallops of the second, inner shielding conductors.

Figure 6:
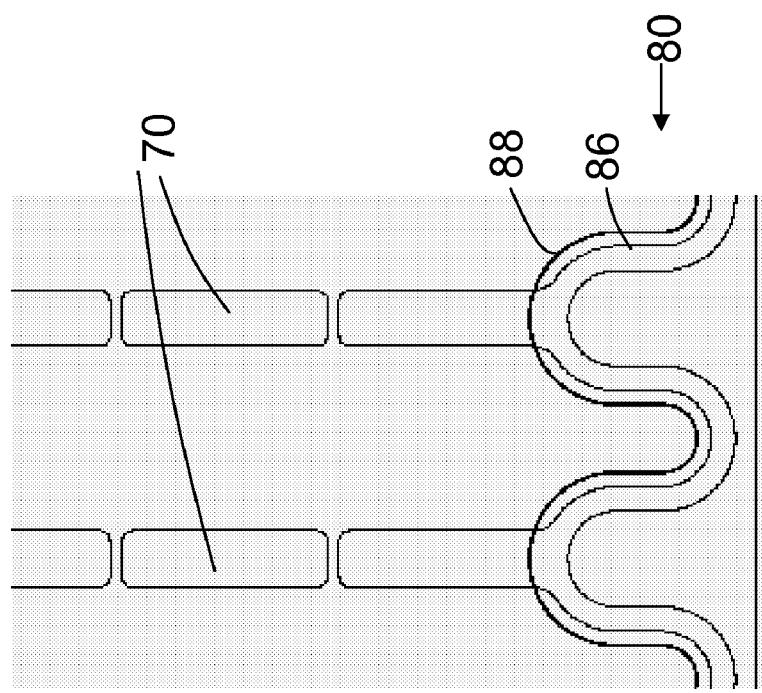

FIG. 6 shows superimposed unrolled layouts of the portions of the outer and inner conductors of one of the end-rings, illustrating the overlap of the outer and inner conductors defining the stripline.

Figure 7:
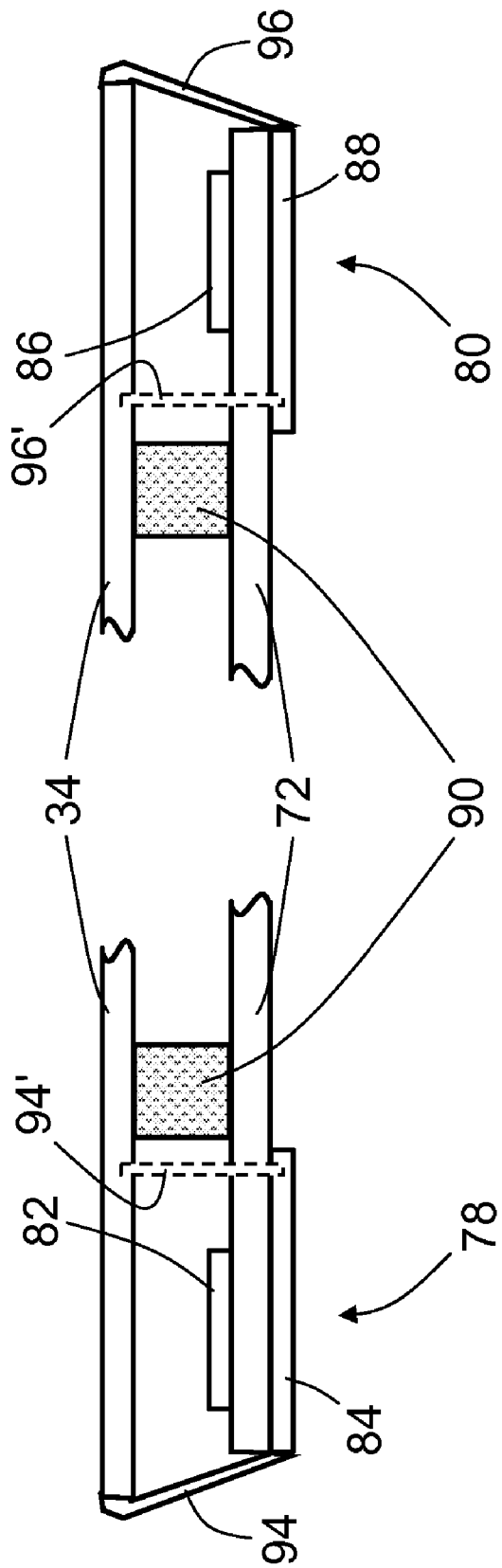

FIG. 7 shows a cross-section of the strip-type end-rings and adjacent portions of the generally cylindrical substrate and shield, including the conductive connection between annular edges of the shield and the inner conductors of the end-rings.

Figure 7A:
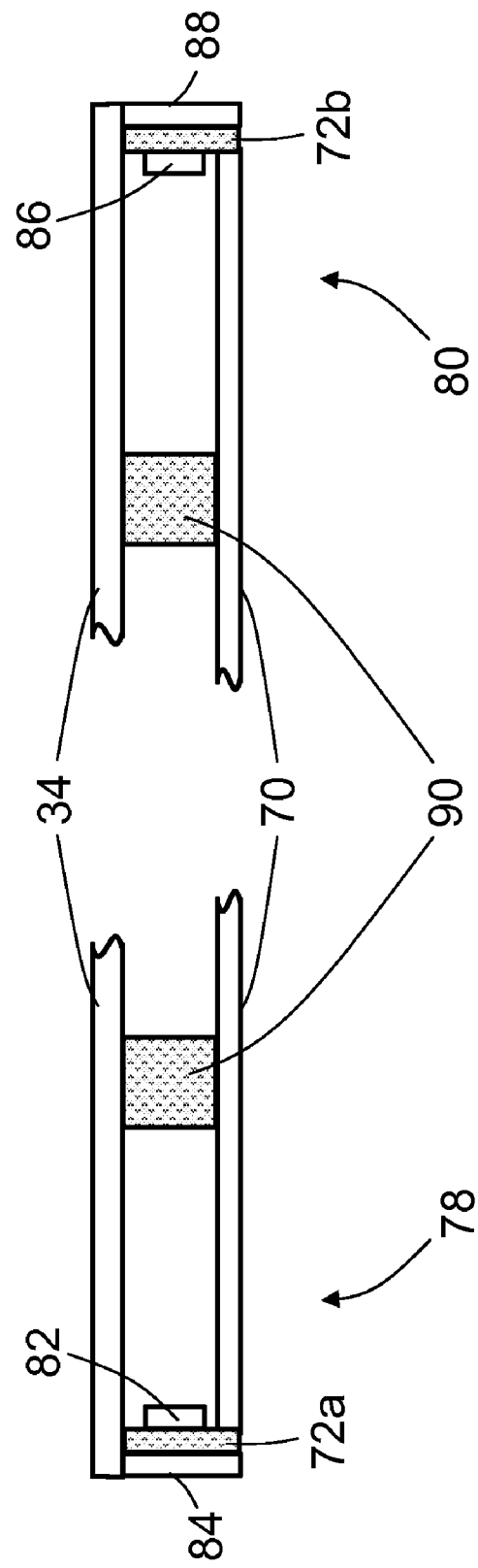

FIGS. 7A and 7B show alternative embodiments of the strip-type end-rings.

FIGS. 8A and 8B show partial unrolled layouts of end-rings each including alternative serpentine first conductors and alternative second shielding conductor shapes (the shielding conductors are drawn with dotted lines in FIGS. 8A and 8B).

Figure 1:
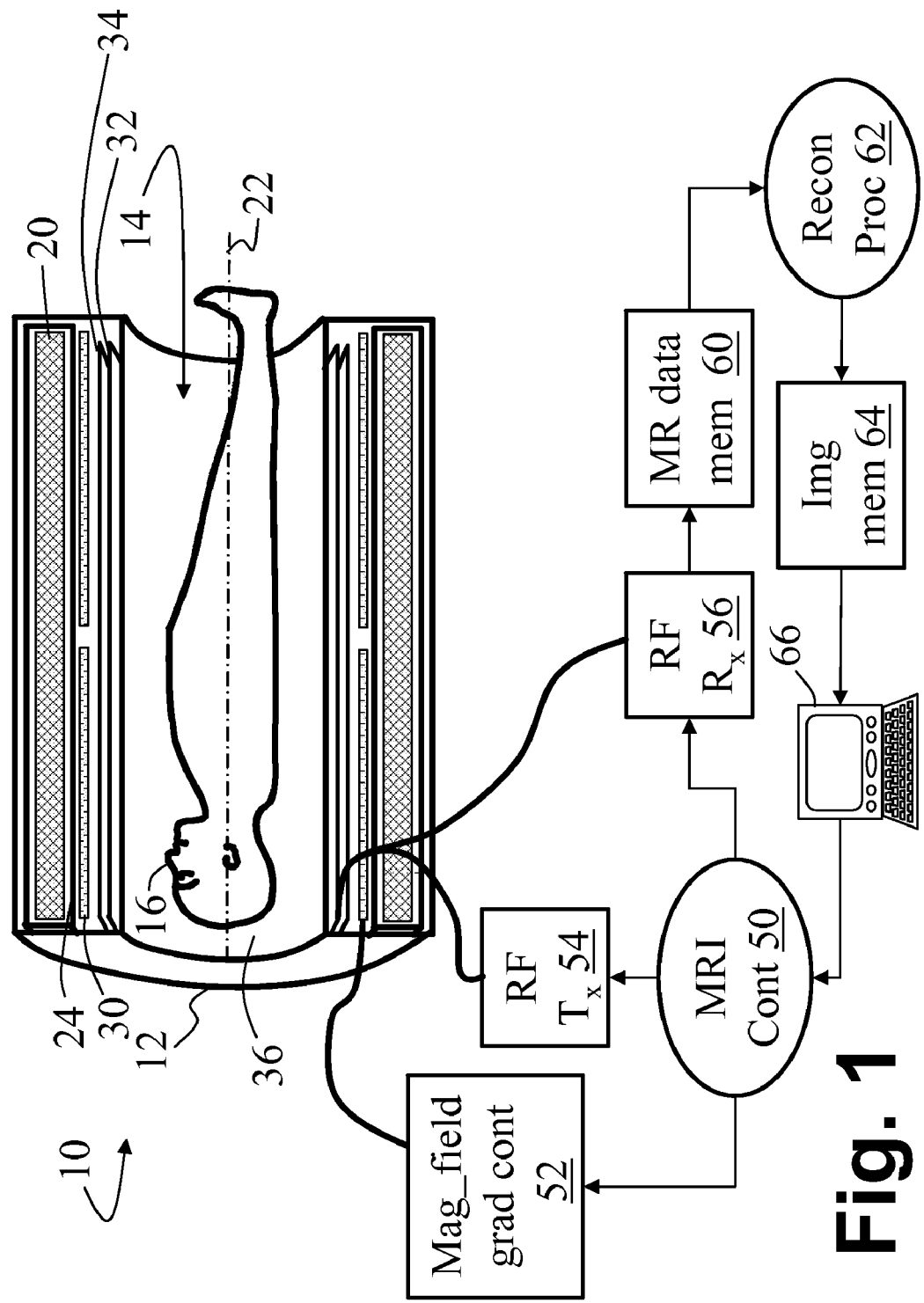

With reference to FIG. 1, a magnetic resonance imaging scanner 10 includes a housing 12 defining an examination region 14 in which is disposed a patient or other imaging subject 16. A main magnet 20 disposed in the housing 12 generates a main magnetic field in the examination region 14. Typically, the main magnet 20 is a superconducting magnet surrounded by cryoshrouding 24; however, a resistive main magnet can also be used. Magnetic field gradient coils 30 are arranged in or on the housing 12 to superimpose selected magnetic field gradients on the main magnetic field within the examination region 14. A whole-body radio frequency coil 32, such as a birdcage coil with a surrounding shield 34, is arranged in or on the housing 12 to inject radio frequency excitation pulses into the examination region 14.

With continuing reference to FIG. 1, a magnetic resonance imaging controller 50 operates magnetic field gradient controllers 52 coupled to the gradient coils 30 to superimpose selected magnetic field gradients on the main magnetic field in the examination region 14, and also operates a radio frequency transmitter 54 coupled to the radio frequency coil 32 to inject selected radio frequency excitation pulses at about the magnetic resonance frequency into the examination region 14. The radio frequency excitation pulses excite magnetic resonance signals in the imaging subject 16 that are spatially encoded by the selected magnetic field gradients. Still further, the imaging controller 50 operates a radio frequency receiver 56 also connected with the radio frequency coil 32 to receive the generated and spatially encoded magnetic resonance signals, and the received spatially encoded magnetic resonance data is stored in a magnetic resonance data memory 60.

A reconstruction processor 62 reconstructs the stored magnetic resonance data into a reconstructed image of the imaging subject 16 or a selected portion thereof lying within the examination region 14. The reconstruction processor 62 employs a Fourier transform reconstruction technique or other suitable reconstruction technique that comports with the spatial encoding used in the data acquisition. The reconstructed image is stored in an images memory 64, and can be displayed on a user interface 66, transmitted over a local area network or the Internet, printed by a printer, or otherwise utilized. In the illustrated embodiment, the user interface 66 also enables a radiologist or other user to interface with the imaging controller 50 to select, modify, or execute imaging sequences. In other embodiments, separate user interfaces are provided for operating the scanner 10 and for displaying or otherwise manipulating the reconstructed images.

The described magnetic resonance imaging system is an illustrative example. In general, substantially any magnetic resonance imaging scanner can incorporate the disclosed radio frequency coils. For example, the scanner can be an open magnet scanner, a vertical bore scanner, a low-field scanner, a high-field scanner, or so forth. In the embodiment of FIG. 1, a single radio frequency coil 32 is used for both transmit and receive phases of the magnetic resonance sequence; however, in other embodiments separate transmit and receive coils may be provided, one or both of which may incorporate one or more of the radio frequency coil designs and design approaches disclosed herein. Still further, while a whole coil 32 is described herein, the radio frequency coil designs and design approaches can also be used for head coils, arm or leg coils, or the like.

With reference to FIGS. 2-7, the example illustrated radio frequency coil 32 includes a plurality of rungs 70, specifically sixteen rungs in the illustrated coil 32. The rungs 70 are arranged in parallel to one another and surround the examination region 14. In the illustrated coil 32, the rungs 70 include printed circuit segments disposed on the outside surface of an electrically non-conducting generally cylindrical substrate 72, with the printed circuit segments of the rungs 70 connected by lumped capacitive elements 74 (shown only in FIG. 2). However, in other embodiments the rungs may be continuous printed circuit segments, continuous free-standing conductors, free-standing conductor segments connected by lumped capacitive elements or conductive traces, transmission lines including overlapping printed circuitry disposed on both the inside and the outside of the generally cylindrical substrate 72, or other types of conductor arrangements.

Two generally annular end-rings 78, 80 are disposed generally transverse to the parallel rungs 70. The end-rings 78, 80 are connected to the rungs 70. The generally annular end-ring 78 includes an outer conductor layer 82 disposed on the outside of the generally cylindrical substrate 72 and an inner conductor layer 84 disposed on the inside of the generally cylindrical substrate 72. The outer and inner conductor layers 82, 84 define a closed-loop transmission line. Similarly, the generally annular end-ring 80 includes an outer conductor layer 86 disposed on the outside of the generally cylindrical substrate 72 and an inner conductor layer 88 disposed on the inside of the generally cylindrical substrate 72. The outer and inner conductor layers 86, 88 define another closed-loop transmission line. The outer conductor layers 82, 86 are suitably formed as printed circuitry on the outside of the generally cylindrical substrate 72, and similarly the inner conductor layers 84, 88 are suitably formed as printed circuitry on the inside of the generally cylindrical substrate 72.

In the illustrated coil 32, the rungs 70 are coupled with the end-rings 78, 80 through conductive connections between printed circuitry defining the outer conductor layers 82, 86 and printed circuitry defining the rungs 70. In other embodiments, the coupling at the magnetic resonance frequency can be achieved via lumped capacitive elements or via capacitive gaps between the end-rings 78, 80 and the ends of the rungs 70. Kirchoff's law should be satisfied at the intersection of the rings and rungs.

The radio frequency shield 34 is generally cylindrical in shape and is arranged concentrically outside of the arrangement of rungs 70 and outside of the generally cylindrical substrate 72. The generally annular end-rings 78, 80 are arranged coaxially with the generally cylindrical radio frequency shield 34. The first or outer conductor layers 82, 86 are disposed at a larger annular radius than the second or inner conductor layers 84, 88. The generally cylindrical radio frequency shield 34 is disposed at a larger cylinder radius than the annular radius of the first conductor layers 82, 86. In the illustrated coil 32, the radio frequency shield 34 is spaced apart from the radio frequency coil 32 by electrically non-conductive spacer elements 90 (best seen in FIGS. 2 and 7).

Figure 3:
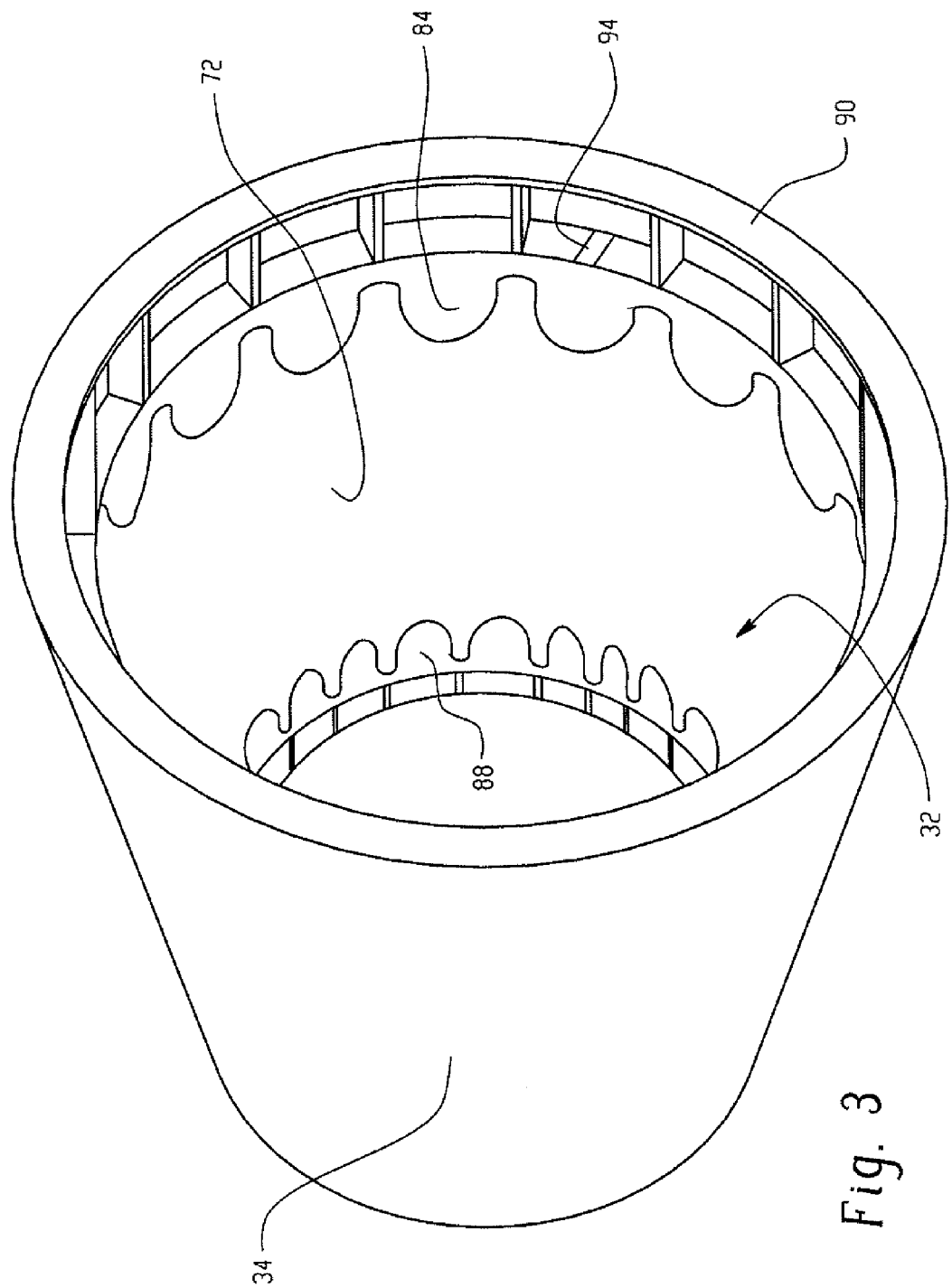
FIG. 3 shows a perspective view of the assembled radio frequency coil and radio frequency shield components of FIG. 1.

With particular reference to FIGS. 3 and 7, the second or inner conductor layer 84 of the end-ring 78 is conductively connected with a proximate annular edge of the generally cylindrical radio frequency shield 34 by a conductor 94. In the illustrated embodiment, the conductor 94 connects the inner conductor layer 84 with the shield 34 along most or all of the proximate annular edge of the shield 34. The edge of the radio frequency shield 34, conductor 94, and inner conductor layer 84 of the end-ring 78 define a lip inside of which is disposed the first or outer conductor layer 82 of the end-ring 78. The inner conductor layer 84 provides the ground plane for the outer conductor layer 82, thus defining a strip-like transmission line. In some contemplated embodiments, the conductive connection between the shield and the inner conductor layer is not continuous along the annular edge, but rather includes periodic conductive connections such as conductive strips spaced apart annually around the annular edge of the generally cylindrical shield.

In similar fashion, the second or inner conductor layer 88 of the end-ring 80 is conductively connected with a proximate annular edge of the radio frequency shield 34 by a conductor 96 (shown only in FIG. 7) along most or all of the annular edge. The edge of the radio frequency shield 34, conductor 96, and inner conductor layer 88 of the end-ring 80 define a lip inside of which is disposed the first or outer conductor layer 86 of the end-ring 80.

The shielding second conductor layers 84, 88 preferably have larger widths than the first conductor layers 82, 86 to provide effective shielding for the latter. The ground conductor layers 84, 88 should overlap the conductor layers 82, 86 by approximately five times the thickness of the substrate 72. In some embodiments, the shielding or compensating is achieved using a limited separation between the conductive strip layers and the associated ground conductor layer.

The first conductor layers 82, 86 have a geometry selected to provide a selected characteristic impedance. The characteristic impedance of the strip-type end-rings 78, 80 formed by the conductor layers 82, 86 and ground conductor layers 84, 88 is defined by the width of the conductor layers 82, 86, the separation between conductor layers 82, 86 and ground conductor layers 84, 88, the width of ground conductor layers 84, 88, and the dielectric constant of the intervening dielectric medium (e.g., the substrate 72).

A length of the end-ring between two neighboring rungs 70 is selected to provide a selected transmission delay. In general, the selected length is greater than a circumferential arc length between the neighboring rungs 70. With particular reference to FIG. 4, to accommodate the extra length of the portions of first conductor layers 82, 86 between neighboring rungs, each first or outer conductor layer 82, 86 of each generally annular end-ring 78, 80 defines a conductor path with directional components transverse to an annular perimeter 100, 102 (indicated by dashed lines in FIG. 4) of the generally annular end-ring 78, 80. For example, in the illustrated embodiment the first or outer conductor layers 82, 86 have serpentine shapes with one serpentine undulation between each pair of neighboring rungs 70. The second, inner shielding conductor layers 84, 88 do not need to precisely comport with the shape of the conductor layers 82, 86. For example, the illustrated inner shielding conductor layers 84, 88 have a scalloped shape that overlaps the conductor layers 82, 86 (overlap best seen in FIG. 6 where the first or outer conductor layer 86 and the second or inner conductor layer 88 of the end-ring 80 are drawn superimposed upon one another).

The outer positioning of the connecting lip conductors 94, 96 simplifies construction. However, other positions for the connecting conductors can be better from a coil performance standpoint. For example, the conductors 94, 96 can be replaced by more inwardly positioned conductors 94', 96' (shown in phantom in FIG. 7), respectively. The more inward positioning respective to the conductor layers 82, 86 reduces parasitic inductance to improve coil performance.

With reference to FIG. 7A, in another alternate embodiment, the generally cylindrical substrate 72 is replaced by two electrically non-conducting annular ring substrates 72a, 72b for each end-ring 78, 80 respectively. The conductor layers 82, 84 are disposed on opposing surfaces of the annular ring substrate 72a. The conductor layers 86, 88 are disposed on opposing surfaces of the annular ring substrate 72b. The electrically non-conductive spacer elements 90 in this embodiment space apart the rungs 70 from the radio frequency screen 34. The rungs may also be transmission lines having an air gap defined by the spacers 90 and the screen 34 as the ground plane. This embodiment is particularly suitable for use in conjunction with high magnetic field (e.g., 7 Tesla) scanners.

With reference to FIG. 7B, in yet another alternate embodiment, the inner conductor layers 84, 88 and connecting conductors 94, 96 are omitted, the conductor layers 82, 86 are arranged on the inside surface of the generally cylindrical substrate 72, and the radio frequency screen 34 is moved onto, or into close enough proximity to, the outside surface of the generally cylindrical substrate 72 to define the ground plane of end-ring transmission lines. Typically, in such an embodiment the rungs (not shown in FIG. 7B) will also be placed on the inside surface of the substrate 72, or may be placed more inwardly, for example lying on spacers 90 and electrically connected with radials 94, 96. The rungs may also include lumped capacitive elements.

While several examples have been illustrated in FIGS. 7, 7A, and 7B, still yet other configurations for strip-type transmission line end-rings are contemplated. The strip-type end-ring should provide a non-radiating transmission line structure of selected impedance and delay. The field of the ring-current is reduced by shielding and/or by compensating current in an associated ground conductor layer. In the embodiments of FIGS. 7, 7A, and 7B, the strip-type end-rings employ a conductor layer and a corresponding ground conductor layer (e.g., conductor layer 82 and ground conductor layer 84)—this is sometimes referred to as a microstrip structure. In other contemplated embodiments, each strip-type end ring includes more than two layers, such as a conductor layer sandwiched between two ground conductor layers—this is sometimes called a stripline structure. The stripline structure provides better high frequency characteristics than the microstrip, especially better shielding, but is more complex to manufacture. As used herein, the term strip-type end-ring includes microstrip end-rings, stripline end-rings, and end-rings formed by other arrangements of two or more conductor layers separated by dielectric layers which define transmission lines.

With reference to FIGS. 8A and 8B, the layouts of the conductor layers of the end-rings can have various shapes that satisfy the desired transmission line characteristics such as characteristic impedance, transmission delay, current distribution, and power dissipation. Similarly, the shielding or ground conductor layers can have various layouts. For example, FIG. 8A shows an alternative end-ring 78' having a first conductor layer 82' defining a square-wave or triangle type serpentine path, and a second shielding conductor layer 84' (drawn in phantom) shaped to overlap the first conductor layer 82'. Rungs 70' extend from the lower portions of the square-wave type serpentine path of the first conductor layer 82'. FIG. 8B shows an alternative end-ring 78" having a first conductor layer 82" defining a smooth serpentine path with two undulations between each pair of rungs 70", and a second shielding conductor layer 84" (drawn in phantom) shaped as a straight strip overlapping the first conductor layer 82".

Those skilled in the art can readily select other configurations for the conductor layers of the strip-type end-rings which provide the desired transmission line characteristics. Substantially any type of strip-line, micro-strip-line, or other strip-type transmission line can be employed, optionally in conjunction with layout techniques employing lumped or semi-lumped elements such as patch capacitors, impedance steps, stubs, and so forth.

The illustrated end-rings 78, 78', 78", 80 employ serpentine shapes with directional components transverse to the annular perimeter of the generally annular end-rings to provide a designed extended length between neighboring rungs. The designed extended length enables tailoring of the transmission delay and other transmission line characteristics, and enables tailoring of the coupling of the end-rings with the rungs through tailoring of transmission line parameters such as the transmission delay and characteristic impedance. This approach eliminates the need for capacitive elements in the end-rings, and eliminates the need for capacitive coupling (when compared to a low-pass or low-pass-like band-pass birdcage configuration) between the end-rings and the rungs. For example, the rungs 70, 70', 70" can be formed of printed circuitry that continuously and conductively connects with the printed circuitry defining the first conductor layers 82, 82', 82", 86.

Elimination of lumped capacitive elements reduces manufacturing complexity and cost. However, in some other contemplated embodiments, lumped capacitive elements are included in the end-rings and/or at the coupling between the end-rings and the rungs to provide tuning or matching.

Although a whole body birdcage-type coil is illustrated, it is to be appreciated that the coils and coil design approaches described herein are readily adapted to constructing other types of radio frequency coils such as head coils, arm- or leg-coils, or the like. In some designs, more or fewer than two end-rings may be provided. For example, in some head coil designs, an end capacitor replaces one of the end-rings, so that the head coil with end capacitor includes only a single end-ring suitably embodied as, for example, one of the end-rings 78, 78', 78".

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having described the preferred embodiments, the invention is now claimed to be:

1. A radio frequency coil for transmitting or receiving signals at a magnetic resonance frequency, the coil comprising:
   an arrangement of substantially parallel rungs;
   one or more generally annular strip type end-rings disposed generally transverse to the parallel rungs and connected with the rungs, each generally annular strip type end-ring including at least two conductor layers separated by a dielectric layer wherein at least one conductor layer of each generally annular end-ring defines a conductor path with directional components transverse to an annular perimeter of the generally annular end-ring; and
   a radio frequency shield substantially surrounding the arrangement of substantially parallel rungs, at least one of the conductor layers of each end-ring being connected with the radio frequency shield.

2. A radio frequency coil for transmitting or receiving signals at a magnetic resonance frequency, the coil comprising:
   an arrangement of substantially parallel rungs;
   one or more generally annular strip type end-rings disposed generally transverse to the parallel rungs and connected with the rungs, each generally annular strip type end-ring including at least two conductor layers separated by a dielectric layer;
   a radio frequency shield substantially surrounding the arrangement of substantially parallel rungs, at least one of the conductor layers of each end-ring being connected with the radio frequency shield; and
   an electrically non-conductive generally cylindrical substrate defining the separating dielectric layers of the one or more end-rings, the substantially parallel rungs being disposed on or in the generally cylindrical substrate oriented substantially parallel to a cylinder axis of the generally cylindrical substrate.

3. The radio frequency coil as set forth in claim 2, wherein the rungs are one of (i) conductive traces and (ii) striplines or microstrips disposed on or in the electrically non-conductive generally cylindrical substrate.

4. The radio frequency coil as set forth in claim 2, wherein at least one conductor layer of each generally annular end-ring has a generally serpentine shape.

5. The radio frequency coil as set forth in claim 2, wherein the end-rings do not include lumped capacitive elements.

6. A radio frequency coil for transmitting or receiving signals at a magnetic resonance frequency, the coil comprising:
   an arrangement of substantially parallel rungs;
   one or more generally annular strip type end-rings disposed generally transverse to the parallel rungs and connected with the rungs, each generally annular strip type end-ring including at least two conductor layers separated by a dielectric layer; and
   a radio frequency shield substantially surrounding the arrangement of substantially parallel rungs, at least one of the conductor layers of each end-ring being connected with the radio frequency shield;
   wherein the conductor layers of each end-ring include a first conductor layer and a second conductor layer substantially parallel with the first conductor layer, the second conductor layer being conductively connected with the radio frequency shield.

7. The radio frequency coil as set forth in claim 6, wherein the radio frequency shield is generally cylindrical, and the second conductor layer of each end-ring conductively connects with a proximate annular edge of the generally cylindrical radio frequency shield.

8. The radio frequency coil as set forth in claim 7, wherein the second conductor layer of each end-ring conductively connects with the proximate annular edge of the generally cylindrical radio frequency shield along most or all of the annular edge.

9. The radio frequency coil as set forth in claim 7, further including:
   an electrically non-conductive generally cylindrical substrate arranged inside of and substantially concentrically with the generally cylindrical radio frequency shield, the generally cylindrical substrate defining the separating dielectric layers of the one or more end-rings.

10. The radio frequency coil as set forth in claim 9, wherein the second conductive layer of each end ring is defined by a portion of the radio frequency shield arranged parallel with the first conductor layer.

11. The radio frequency coil as set forth in claim 6, wherein the end-rings do not include lumped capacitive elements.

12. A radio frequency coil for transmitting or receiving signals at a magnetic resonance frequency, the coil comprising:
   an arrangement of substantially parallel rungs;
   one or more generally annular strip type end-rings disposed generally transverse to the parallel rungs and connected with the rungs, each generally annular strip type end-ring including at least two conductor layers separated by a dielectric layer; and a radio frequency shield substantially surrounding the arrangement of substantially parallel rungs, at least one of the conductor layers of each end-ring being connected with the radio frequency shield;

wherein the conductor layers of each end-ring include:
- a first conductor layer, and
- a second conductor layer defined by a portion of the radio frequency shield arranged substantially parallel with the first conductor layer.

13. The radio frequency coil as set forth in claim 12, wherein at least one conductor layer of each generally annular end-ring has a generally serpentine shape.

14. The radio frequency coil as set forth in claim 12, wherein the end-rings do not include lumped capacitive elements.

15. A magnetic resonance scanner comprising:
- a main magnet generating a main magnetic field in an examination region;
- magnetic field gradient coils superimposing selected magnetic field gradients on the main magnetic field in the examination region; and
- a radio frequency coil as set forth in claim 12.

16. A radio frequency coil for transmitting or receiving signals at a magnetic resonance frequency, the coil comprising:
- an arrangement of substantially parallel rungs;
- one or more generally annular strip type end-rings disposed generally transverse to the parallel rungs and connected with the rungs, each generally annular strip type end-ring including at least two conductor layers separated by a dielectric layer wherein the dielectric layer of each end ring defines an electrically non-conducting annular ring substrate, and the at least two conductor layers are disposed on opposing surfaces of the annular ring substrate; and
- a radio frequency shield substantially surrounding the arrangement of substantially parallel rungs, at least one of the conductor layers of each end-ring being connected with the radio frequency shield.

17. The radio frequency coil as set forth in claim 16, wherein at least one conductor layer of each generally annular end-ring has a generally serpentine shape.

18. The radio frequency coil as set forth in claim 16, wherein the end-rings do not include lumped capacitive elements.

19. A radio frequency coil for transmitting or receiving signals at a magnetic resonance frequency, the coil comprising:
- an arrangement of substantially parallel rungs;
- one or more generally annular strip type end-rings disposed generally transverse to the parallel rungs and connected with the rungs, each generally annular strip type end-ring including at least two conductor layers separated by a dielectric layer; and
- a radio frequency shield substantially surrounding the arrangement of substantially parallel rungs, at least one of the conductor layers of each end-ring being connected with the radio frequency shield;

wherein the two conductors of each end-ring include:
- a first conductor, and
- a second conductor connected with the radio frequency shield,
- a width and length of the first conductor between neighboring rungs being designed to provide a selected impedance and delay that cooperates with the rungs to tune the coil.

20. The radio frequency coil as set forth in claim 19, wherein (i) a width of the first conductor is selected to provide a selected characteristic impedance of the stripline and (ii) a length of the first conductor between two neighboring rungs is selected to provide a selected delay of the stripline.

* * * * *